US010587026B2

(12) United States Patent
Holloway et al.

(10) Patent No.: US 10,587,026 B2
(45) Date of Patent: Mar. 10, 2020

(54) FULLY INTEGRATED BROADBAND INTERCONNECT

(71) Applicant: The Government of the United States of America, as represented by the Secretary of the Navy, Arlington, VA (US)

(72) Inventors: Jack W. Holloway, Arlington, VA (US); Ruonan Han, Winchester, MA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 102 days.

(21) Appl. No.: 15/882,771

(22) Filed: Jan. 29, 2018

(65) Prior Publication Data

US 2018/0219270 A1 Aug. 2, 2018

Related U.S. Application Data

(60) Provisional application No. 62/451,398, filed on Jan. 27, 2017.

(51) Int. Cl.
*H01P 5/08* (2006.01)
*H01P 5/02* (2006.01)
(Continued)

(52) U.S. Cl.
CPC .............. *H01P 5/087* (2013.01); *H01L 23/15* (2013.01); *H01L 23/5226* (2013.01);
(Continued)

(58) Field of Classification Search
CPC . H01P 5/028; H01P 5/087; H01P 3/16; H01L 23/15; H01L 23/53257; H01L 23/5226; H01Q 13/22
(Continued)

(56) References Cited

U.S. PATENT DOCUMENTS

2002/0021197 A1* 2/2002 Elco .................. H01P 1/16
333/248
2010/0328188 A1* 12/2010 Chang .................. H01Q 21/064
343/893

OTHER PUBLICATIONS

W. Liu et al., "Exploration of electrical and novel optical chip-to-chip interconnects," IEEE Des. Test., vol. 31, No. 5, pp. 28-35, Oct. 2014.

(Continued)

*Primary Examiner* — Robert J Pascal
*Assistant Examiner* — Jorge L Salazar, Jr.
(74) *Attorney, Agent, or Firm* — US Naval Research Laboratory; Roy Roberts

(57) ABSTRACT

Embodiments herein relate to a fully integrated broadband interconnect. The system comprises a first integrated circuit, a second integrated circuit, and a coupler structure to connect the first and second integrated circuits, where the coupler structure includes a base portion and a top portion that are connected by two vertical walls. The top portion has a gap that increases a strength of a transverse electric field across the gap when the coupler structure is operating in an odd higher order mode that is horizontally polarized, where the coupler structure is full of a dielectric material, and where the cross-sectional width of the coupler structure is tapered in a direction of wave propagation. The system further comprises a dielectric waveguide attached to the top portion of the coupler structure, where the dielectric waveguide supports the odd higher order mode and an even higher order mode.

11 Claims, 6 Drawing Sheets

(51) Int. Cl.
  *H01P 3/16* (2006.01)
  *H01L 23/15* (2006.01)
  *H01L 23/532* (2006.01)
  *H01L 23/522* (2006.01)
  *H01Q 13/22* (2006.01)

(52) U.S. Cl.
  CPC .......... *H01L 23/53257* (2013.01); *H01P 3/16* (2013.01); *H01P 5/028* (2013.01); *H01Q 13/22* (2013.01)

(58) Field of Classification Search
  USPC .... 333/22 R, 81 B, 157, 208, 211, 239, 248, 333/254, 255, 21 A
  See application file for complete search history.

(56) References Cited

OTHER PUBLICATIONS

V. Kumar, R. Bashirullah, and A. Naeemi, "Modeling, optimization and benchmarking of chip-to-chip electrical interconnects with low loss air-clad dielectrics," in Proc. IEEE 61st Electron. Compon. Technol. Conf. (ECTC), May 2011, pp. 2084-2090.

Q. J. Gu, "THz interconnect: The last centimeter communication," IEEE Commun. Mag., vol. 53, No. 4, pp. 206-215, Apr. 2015.

A. E.-J. Lim et al., "Review of silicon photonics foundry efforts," IEEE J. Sel. Topics Quantum Electron., vol. 20, No. 4, Jul./Aug. 2014.

J. S. Orcutt and R. J. Ram, "Photonic device layout within the foundry CMOS design environment," IEEE Photon. Technol. Lett., vol. 22, No. 8, pp. 544-546, Apr. 15, 2010.

J. Michel and L. C. Kimerling, "Electronics and photonics: Convergence on a silicon platform," in Proc. 33rd Eur. Conf. Ehxibit. Opt. Commun. (ECOC), Sep. 2007, pp. 1-2.

D. J. Shin et al., "Integration of silicon photonics into DRAM process," in Proc. Opt. Fiber Commun. Conf. Expo. Nat. Fiber Opt. Eng. Conf. (OFC/NFOEC), Mar. 2013, pp. 1-3.

C. Sun et al., "A monolithically-integrated chip-to-chip optical link in bulk CMOS," IEEE J. Solid-State Circuits, vol. 50, No. 4, pp. 828-844, Apr. 2015.

A. Arbabian, N. Dolatsha, and N. Saiz, "Fully packaged millimetre-wave dielectric waveguide with multimodal excitation," IEEE Electron. Lett., vol. 51, No. 17, pp. 1339-1341, Aug. 2015.

W. Volkaerts, N. Van Thienen, and P. Reynaert, "An FSK plastic waveguide communication link in 40 nm CMOS," in IEEE Int. Solid-State Circuits Conf. (ISSCC) Dig. Tech. Papers, Feb. 2015, pp. 1-3.

A. Hajimiri, "mm-Wave silicon ICs: Challenges and opportunities," in Proc. IEEE Custom Integr. Circuits Conf. (CICC), Sep. 2007, pp. 741-747.

E. Afshari and R. Han, "Progress towards mW-power generation in CMOS THz signal sources," in Proc. Eur. Microw. Integr. Circuits Conf. (EuMIC), Oct. 2013, pp. 117-120.

C. Jiang, A. Cathelin, and E. Afshari, "An efficient 210 GHz compact harmonic oscillator with 1.4 dBm peak output power and 10.6% tuning range in 130 nm BiCMOS," in Proc. IEEE Radio Freq. Integr. Circuits Symp. (RFIC), May 2016, pp. 194-197.

J.-D. Park and A. M. Niknejad, "Y-band on-chip dual half-width leakywave antenna in a nanoscale CMOS process," IEEE Antennas Wireless Propag. Lett., vol. 12, pp. 1476-1479, 2013.

N. Marcuvitz, Waveguide Handbook, Chapter 8: Composite Structures. New York, NY, USA: Dover, 1965.

E. A. J. Marcatili, "Dielectric rectangular waveguide and directional coupler for integrated optics," Bell Syst. Tech. J., vol. 48, No. 7, pp. 2071-2102, Sep. 1969.

* cited by examiner

FULLY INTEGRATED BROADBAND INTERCONNECT

CROSS-REFERENCE TO RELATED APPLICATIONS

This Application is a non-provisional application claiming priority to provisional application 62/451,398 filed on Jan. 27, 2017, under 35 USC 119(e). The entire disclosure of the provisional application is incorporated herein by reference.

BACKGROUND

Traditional interchip interconnect technologies, when deployed for terascale data storage and computing, face issues in transfer speed and energy consumption. The excessive ohmic loss and dispersion associated with copper interconnects in high performance electronic systems have led to a number of efforts focusing on characterization of the physical interconnects, high-speed drivers, and channel equalization in an attempt to mitigate these challenges. In addition, solutions to the board-level (i.e., 1-10 cm link length) and back plane-level (i.e., 10-100 cm link length) interconnects have garnered much attention around electro-optical solutions. These solutions suffer from integration issues surrounding laser sources, waveguides, and photonic devices with traditional silicon systems, as well as electrical-optical/optical-electric conversion and waveguide-chip interfacing issues associated with coupling power on- and off-chip.

A number of efforts have focused on all-electronic solutions to the short-range chip-to-chip communication problem, involving coupling a modulated mmWave or sub-mmWave carrier into a dielectric waveguide—so-called "radio over fiber" schemes. These concepts attempt to harness the wider available bandwidths at these higher frequencies, and require on- and off-chip apertures to radiate into polymer or silicon waveguides. These traditional schemes use lower carrier frequencies, leading to lower bandwidth and I/O density. A number of these works are based on off-chip components, which introduce integration challenges and do not readily lend themselves to higher frequency operation.

Techniques utilizing off-chip radiators, aside from increasing system integration complexity, inherently trade the original bandwidth distance constraint of copper interconnects in driving an off-chip coupler. This effect manifests itself as a decrease in coupling efficiency. In the case of a dual band coupler utilizing mode orthogonality, such systems have been demonstrated with a bandwidth of 35 GHz and coupling loss of 5 dB. A number of efforts have utilized die-to-package bond wires or patch antennas as radiators, coupling energy into plastic tube waveguides. For example, a traditional coupler was demonstrated with a bandwidth of 6 GHz and a coupling loss of 6 dB utilizing air core plastic tube waveguides. This approach presents a number of integration challenges in packaging, especially when high-density I/O integration is needed. Lastly, work has been done on utilizing integrated on-chip antennas to couple modulated carriers into waveguides. In another example, a traditional coupler with a bandwidth of 8 GHz was implemented using a micromachined silicon waveguide, exhibiting a coupling loss of 5.8 dB. While these efforts address the need for an on-chip coupler, they suffer from the well-known bandwidth-radiation efficiency tradeoffs associated with on-chip resonant antennas. This approach also requires the waveguide interface itself to be normal to the radiator surface to maximize the coupling efficiency.

SUMMARY

Embodiments herein relate to a fully integrated broadband interconnect. The system comprises a first integrated circuit, a second integrated circuit, and a coupler structure to connect the first and second integrated circuits, where the coupler structure includes a base portion and a top portion that are connected by two vertical walls. The top portion has a gap that increases a strength of a transverse electric field across the gap when the coupler structure is operating in an odd higher order mode that is horizontally polarized, where the coupler structure is full of a dielectric material, and where the cross-sectional width of the coupler structure is tapered in a direction of wave propagation. The system further comprises a dielectric waveguide attached to the top portion of the coupler structure, where the dielectric waveguide supports the odd higher order mode and an even higher order mode.

DESCRIPTION

Figure 1:
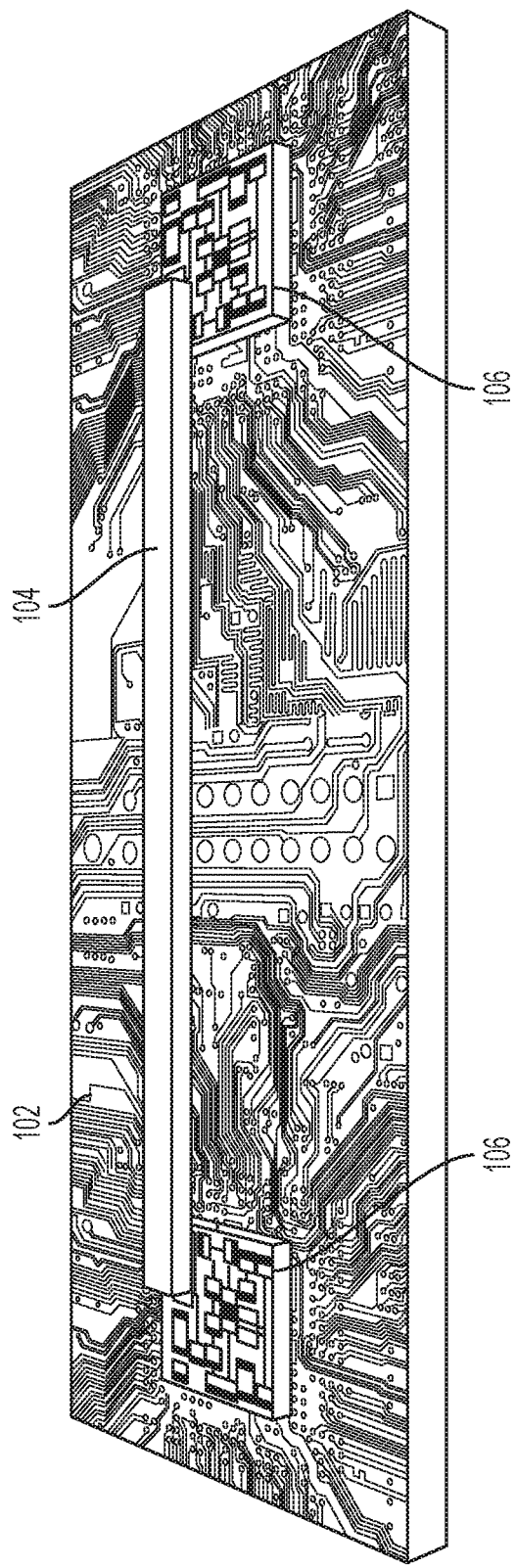
FIG. 1 shows an example fully planar chip-waveguide interface.

Embodiments of the invention uses a link based on the 220-325 GHz dielectric waveguide and a new class of integrated traveling wave coupler. This coupler is based on a differentially driven half-mode substrate integrated waveguide (HMSIW) topology. The embodiments described herein are compatible with existing commercial integrated circuit (IC) processes and require no wafer postprocessing. This coupler lends itself to straightforward planar integration with a simple rectangular dielectric waveguide. The overall system-level integration concept is illustrated in FIG. 1. The sub-mmWave frequency range provides much higher bandwidth and data rate compared to mmWave approaches. In addition, the smaller wavelengths in the sub-mmWave regime, compared to mmWave frequency ranges, provide smaller waveguide sizes and smaller guide-to-guide pitches, further increasing the density of high-bandwidth links.

The rapid progress of sub-mmWave and THz signal generation and detection in silicon processes has also spurred interest in modulated sub-mmWave and THz waves for wireline communication. Power generation at these frequencies in silicon typically relies on the use of nonlinearities to produce harmonics, from which the appropriate frequency component is extracted. A SiGe-based THz harmonic oscillator can be implemented with a dc-to-THz conversion efficiency of 2.4%. With increasing silicon device cutoff frequencies, the use of fundamental-mode power generation is an attractive potential, with subsequent improvements in dc-to-THz conversion efficiency. Additionally, receivers in silicon have been demonstrated with sensitivity as low as 29 pW/√Hz. Assuming a nominal detector noise equivalent power (NEP) with an additive white Gaussian noise (AWGN) channel, available bandwidth of 50 GHz, channel and coupler loss of approximately 20 dB, and dc-to-THz conversion efficiencies reported in the literature, embodiments of the invention can theoretically achieve a link efficiency better than 1 pJ/b. The use of coherent detection may further improve the efficiency of such a link. These link efficiency figures make this technology attractive for terascale links with high-density integration.

FIG. 1 shows an example fully planar chip-waveguide interface. Specifically, FIG. 1 shows a printed circuit board (PCB) 102 with two chips 106 that are connected via a dielectric waveguide 104. The dielectric waveguide 104 supports two quasi-transverse-electric modes and is described in more detail below with respect to FIG. 2. Embodiments of the invention use a modified leaky wave antenna (LWA) structure in which a coupler cross section is tapered to capitalize on the traveling wave structure's inherent bandwidth while decreasing the required structure length.

Figure 2:
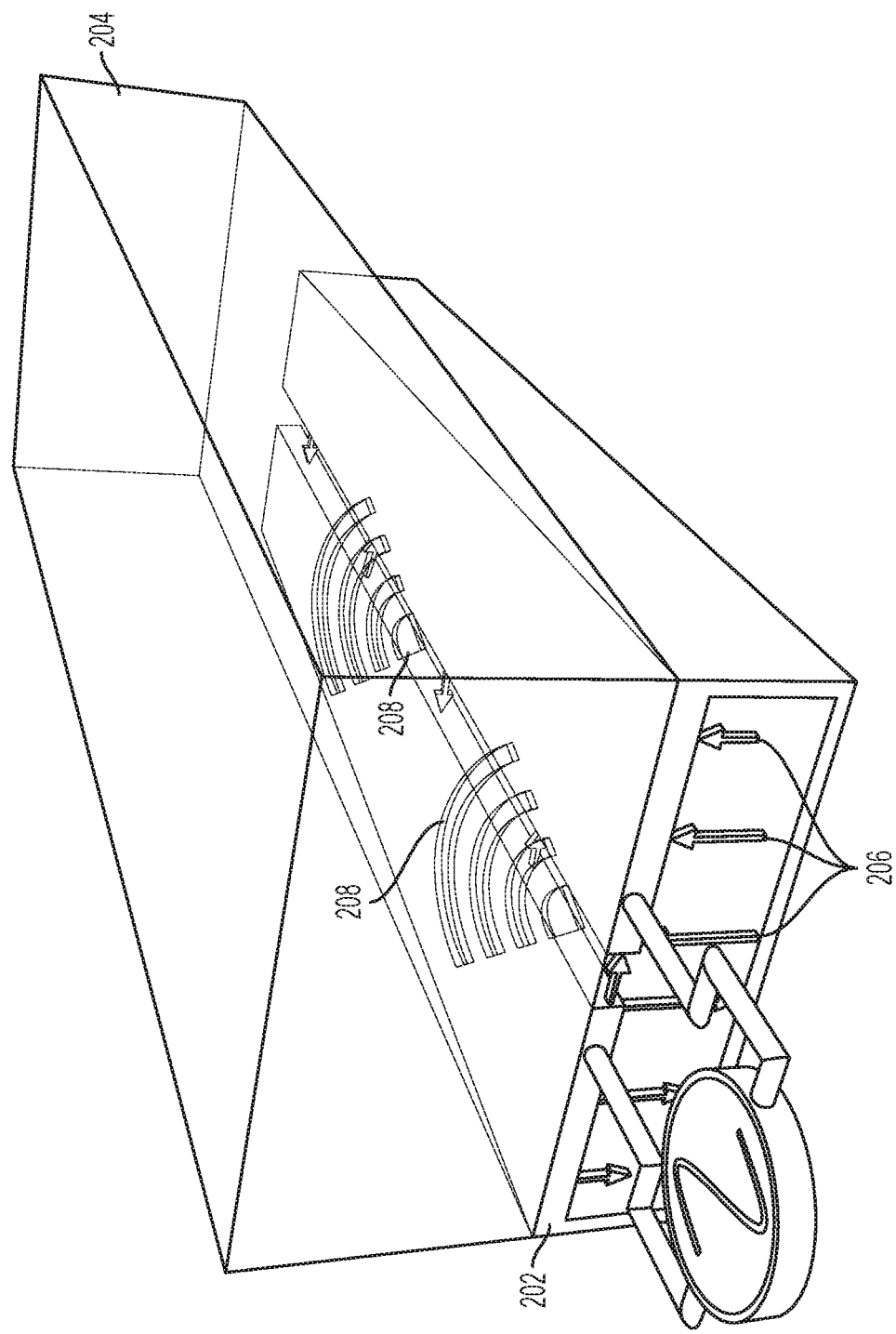
FIG. 2 shows an example of two half-mode substrate integrated waveguides (SIWs) that are differentially-driven.

FIG. 2 shows an example of two half-mode SIWs that are differentially-driven. Specifically, FIG. 2 shows a coupler structure 202 connected to a dielectric waveguide 204 with the confined electric field 206 and leaky radiation 208 of the coupler structure 202. When fully implemented in a silicon chip, the coupler structure 202 requires neither wafer post-processing nor off-chip radiators and allows for a low-cost and readily integrated solution for high-bandwidth short range chip-to-chip communication. In some embodiments, the coupler structure 202 is measured with more than 50 GHz of bandwidth, a coupling loss of 4.8 dB, and flat dispersion across the frequency band of 220-270 GHz.

Figure 3A:
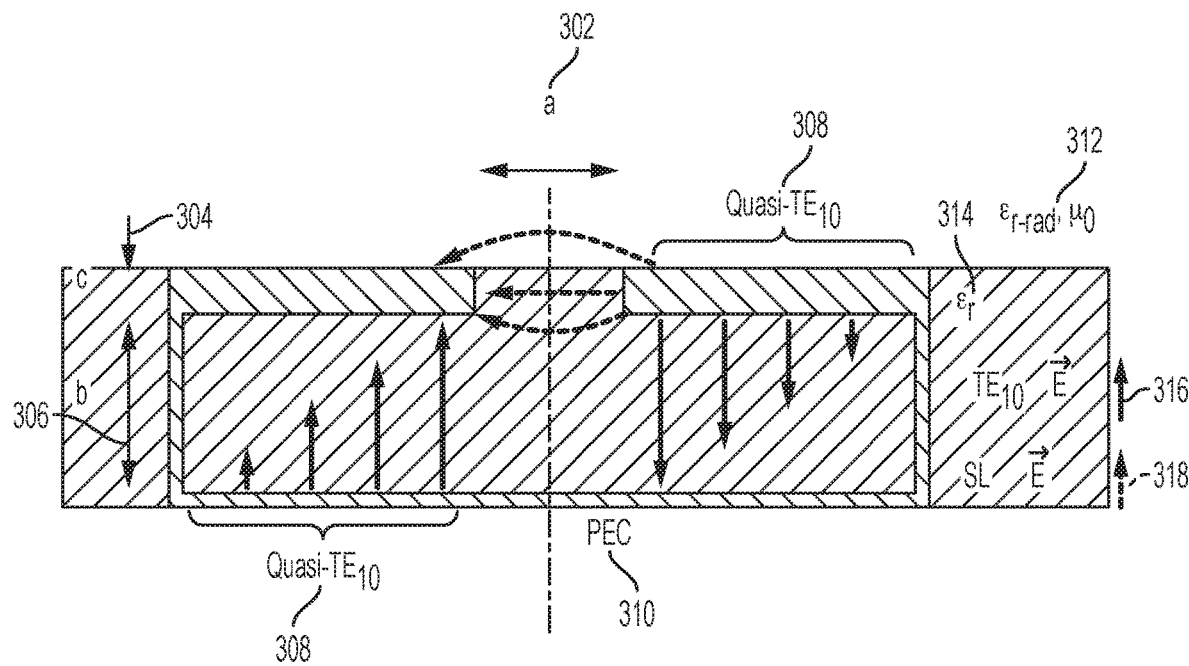
FIGS. 3A and 3B show example operating modes of a waveguide in accordance with embodiments of the invention.

Single-sided HM-SIW antennas are traveling wave radiators that support the first microstrip higher order mode (generally referred to as the EH1 mode). Constant-cross-sectional variants have been integrated on chip, and their single- and differentially-driven variants have been used in arrays. In some of these variants, it is shown that the frequency at which a mode is said to be in the leaky wave region, which can be defined as:

$$\alpha < \beta < k_0 \sqrt{\epsilon_{r,-rad}} \quad (1)$$

and decreased if the structure is excited by the odd $EH_1$ mode, where $k_0$ is the free space wavenumber. The longitudinal wave number can be defined as:

$$k_z = \beta - j\alpha \quad (2)$$

and the dielectric constant of the material where the leaky wave power radiates is denoted by $\epsilon_{r,-rad}$ 312 as shown in FIG. 3A. In this example, $\beta$ is the propagation constant and $\alpha$ is the corresponding attenuation constant of a time-harmonic mode.

Figure 3B:
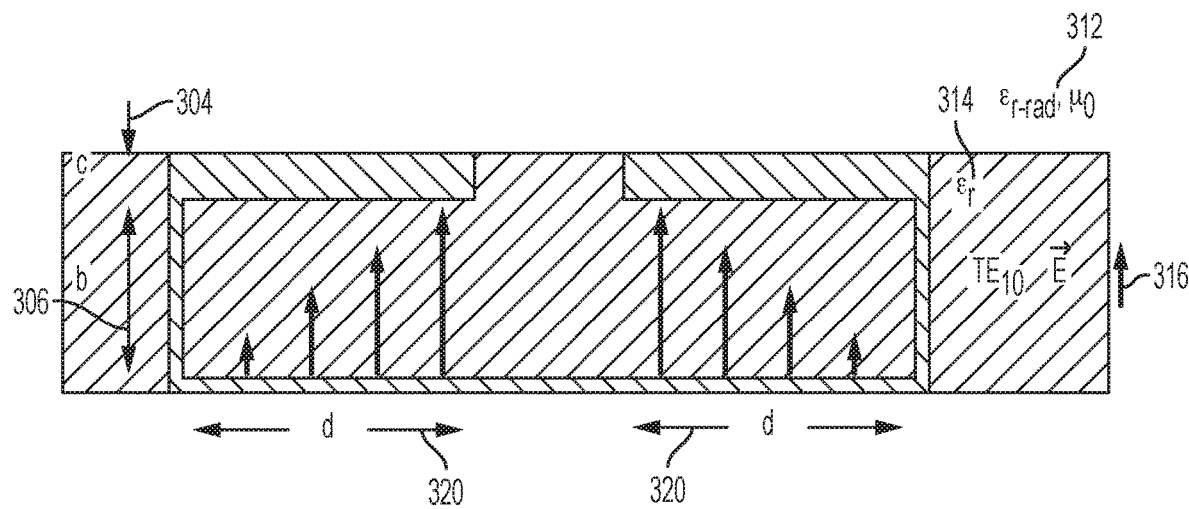

Consider a constant cross-sectional coupler structure 202 as illustrated in FIGS. 3A-3B. The inner dimension of the full HM-SIW width can be denoted as 2d+a, with the inner height dimension b 306, the slot width a 302, and the top conductor thickness c 304. The HM-SIW coupler shown in FIGS. 3A and 3B is filled with a material with dielectric constant $\epsilon_r$ 314. The entire structure couples to an infinite half-space with dielectric constant $\epsilon_{r,-rad}$ 312.

The HM-SIW coupler structure supports both odd and even $EH_1$ modes, which are respectively shown in FIGS. 3A and 3B. When supporting the odd $EH_1$ mode as shown by the solid 316 and dashed red arrows 318 in FIG. 3A, the frequency at which leaky-wave behavior begins for a given structure width is decreased over that of a half-mode LWA or the same structure excited by the even $EH_1$ mode shown in FIG. 3B. In addition, using the odd $EH_1$ mode of FIG. 3A increases the power radiated due to leaky radiation (described by the attenuate constant $\alpha$) at a given frequency over the even $EH_1$ mode of FIG. 3B or a traditional half-mode LWA. By utilizing the odd $EH_1$ mode of FIG. 3A for a given cross section, the amount of energy coupled into a space-leaky mode can be enhanced and the overall required radiator length decreased while maintaining coupling efficiency compared with a structure excited by the even $EH_1$ mode of FIG. 3B or a half-mode LWA supporting a $TE_{10}$ mode.

When excited with the odd $EH_1$ mode, a portion of the electric field contained within the structure and far from the central slot resembles half of a $TE_{10}$ rectangular waveguide mode. In the following discussion, this portion of the mode is referred to as the quasi-$TE_{10}$ 308 portion, and this portion of the field is denoted by the solid red lines 316 in FIG. 3A. Near the center slot, the increased electric field strength across the gap causes the electric field lines from the top conductor near the gap to terminate, not vertically onto the bottom conductor, but rather on the top conductor on the opposite side of the gap. These fields are similar to a conductor-backed slot-line mode. This portion of the mode is denoted by the dashed electric field lines 318.

It should be noted that, for a given guide width 2d+a, which is approximated by 2d, at frequencies above:

$$f_{TE} \approx \frac{c_0 \sqrt{\epsilon_r}}{4d} \quad (3)$$

where $c_0$ is the free-space speed of light, the energy in the quasi-$TE_{10}$ 308 field is well-confined in those rectangular waveguide regimes on the structure to the left and right of the center slot. As the wavelength of the supported mode is increased, each rectangular guide section of length d 320 can no longer fully support a quarter wave, and some portion of this energy is coupled into the electric field supported between the center slot and the bottom conductor. This portion of the mode is shown by the slot-line fields denoted by the dashed field lines 318 in FIG. 3A. Once this energy has been coupled into this regime, it will radiate away from the structure in a space leaky mode if the mode's propagation constant satisfies equation (1). In the slot and near field, this coupler structure produces an electric field in which the major component is aligned horizontally, which is matched with the desired horizontally polarized mode in the dielectric waveguide. The similarity between the desired waveguide mode and coupler radiative modes aides in energy coupling. This is in contrast with the field distribution created by a traditional patch antenna. The fringe fields at the edge of a patch form horizontally polarized electric fields in the far field, but the near-field modes have much more structure. Traditional patch antennas exhibit larger near-field electric field intensity at the edge with smaller field intensity in the center of the patch. The dissimilarity, in the near field, of this mode and the desired waveguide mode does not encourage energy coupling from the radiative mode into the waveguide mode.

By decreasing the structure width, 2d, longitudinally as shown in FIG. 2, such a coupler structure 202 produces regions in which energy in a previously propagating quasi- TE$_{10}$ portion of the mode impinges on a narrower cross section where that energy couples into the field supported across the center gap. By virtue of the differential excitation (the odd EH$_1$ mode shown in FIG. 3A), this same structure facilitates the lower frequency onset of space-leakage, as defined in (1), and simultaneously increases the rate of leakage a over the leaky regime. In this way, this coupler structure 202 is able to radiate with the same efficiency while requiring less length.

The coupler structure 202 provides a number of advantages over traditional on-chip antennas:
1. Its enclosed nature provides mode confinement away from the bulk silicon, thus decreasing unwanted energy coupling into the substrate.
2. The coupler structure 202 is a traveling wave structure leading to a wider bandwidth than in resonant structures.
3. The coupler near-field mode is structurally similar to the desired mode of the dielectric waveguide, improving coupling efficiency.

Figure 3C:
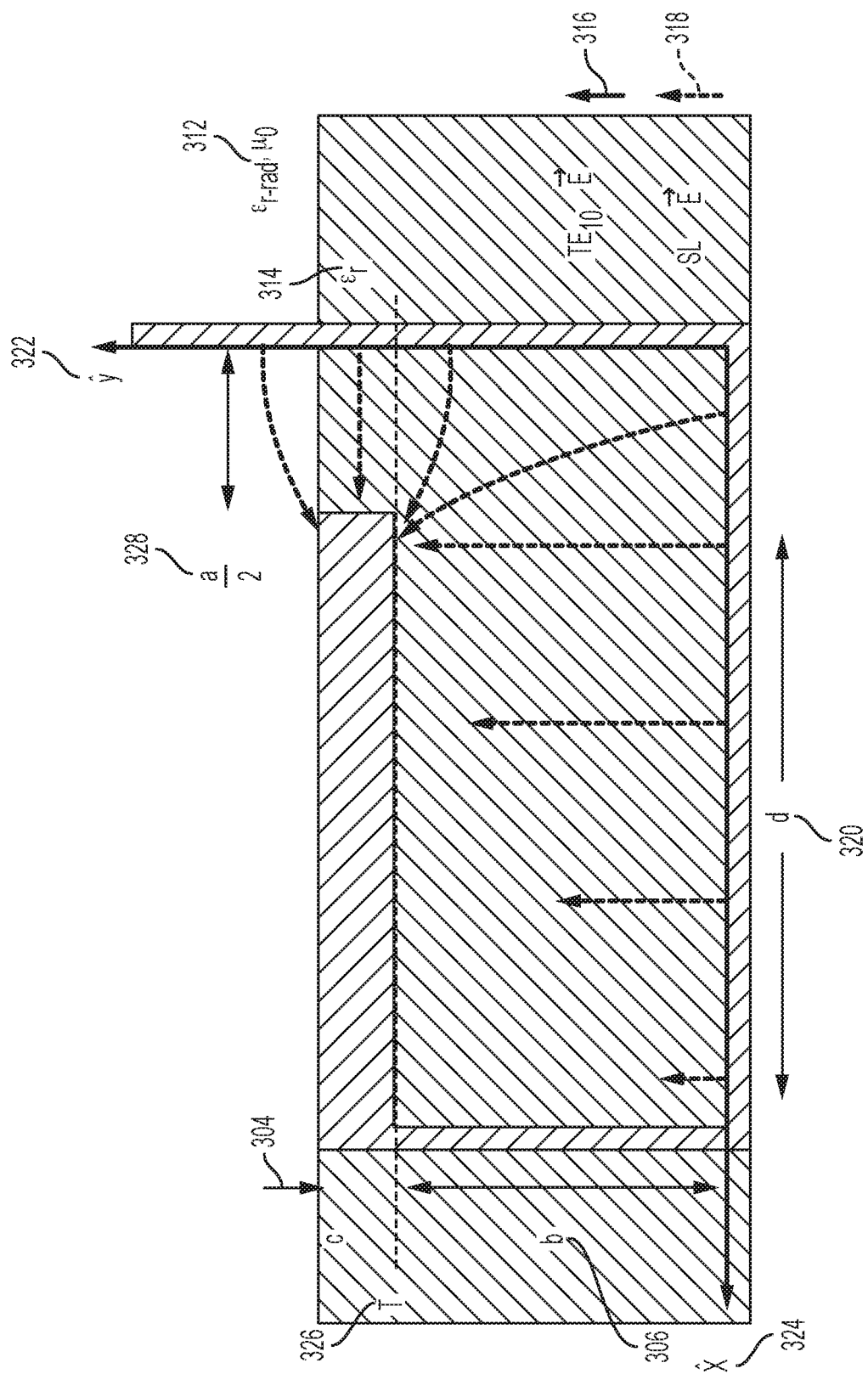
FIG. 3C shows an operating mode for a half-structure waveguide.

Structures similar to the coupler structure shown in FIG. 3C have been studied using modal analysis that assumed a zero-thickness top conductor. In contrast, the coupler structure described herein makes use of a thick top metal of thickness c 304. The conductor-backed slot-line and its odd hybrid mode behavior have also been modeled, utilizing both modal analysis and circuit approximations; however, this analysis does not support modes constrained laterally in the bottom portion of the structure. In contrast, the operation of the coupler structure of FIGS. 3A and 3B relies on the vertical SIW walls to contain energy that might otherwise be dissipated into bulk silicon surface waves. In a comparison with full-wave analysis, both of the aforementioned analyses were found to deviate significantly.

An analytical model of the relationship of the odd EH$_1$ mode longitudinal propagation constant, k$_z$, as a function of guide dimensions provides insight into the space leaky wave behavior, or the propagation constant β to be specific, as the cross section of the structure is modified. With respect to FIGS. 3A and 3B, it can be assumed that the conductors (physically realized by aluminum metallization and arrays of tungsten vias) are perfect electric conductors (PECs) 310. Further, the electric field distribution of the odd EH$_1$ mode shown in FIG. 3A is differentially symmetric, and thus its transverse equivalent network can be represented by a half structure utilizing a PEC boundary condition such as the one shown in FIG. 3C.

The geometry in FIG. 3C can be analyzed by a closed-form transverse resonance expression. The resonance condition plane T 326, denoted by the dashed horizontal line, provides a convenient reference with which to categorize the energy stored in various portions of the fringe fields near the center gap.

Susceptances account for stored energy in the main guide (below the resonance plane T 326) underneath the slot. Above the resonance plane T 326, it is assumed that the gap 328 is narrow enough such that only a transverse electric field is supported across the gap 328. In the gap 328 between the top conductors, from T 326 to the $\epsilon_r$-$\epsilon_{r-rad}$ dielectric interface, a horizontally polarized TE$_{10}$ mode (that is E$_x$≠0, E$_y$=E$_z$=0), is supported in the vertical ŷ direction 322. The equivalent susceptances of the energy stores in the field directly above T are written as:

$$\frac{B_s}{Y_0} = \frac{4b}{\lambda_g} \ln \csc \frac{\pi a}{2b} \tag{4}$$

where the guide wavelength is:

$$\lambda_g = \frac{\lambda_0}{\sqrt{e_r - \left(\frac{\lambda_0}{4d}\right)^2}}. \tag{5}$$

The coupling coefficient, modeled by a hypothetical transformer in a structure such as shown in FIG. 3C with a turns ratio of:

$$n_{cs} = n_c \sqrt{\frac{a}{b}} \tag{6}$$

accounts for the difference in the modal voltages in the horizontal portion of the structures and those in the gap 328. The short section of vertical parallel plate, of length c 304 along ŷ 322, seen from reference plane T 326 and up can be represented as a short transmission line of length c 304. The admittance looking into this transmission line can be expressed as:

$$\frac{Y_c}{Y_0} = \frac{\frac{Y_r}{Y_0} + j\tan k_y c}{1 + j\frac{Y_C}{Y_0}\tan k_y c}. \tag{7}$$

The equivalent radiation admittance from a rectangular waveguide into a dielectric half-space is:

$$\frac{Y_r}{Y_0} = \frac{G_r + jB_r}{Y_0} = \frac{\sinh\left(\frac{k_y a}{2}\right) + j\sqrt{e_r}\sin A}{\cosh\left(\frac{k_y a}{2}\right) + \cos A} \tag{8}$$

for $$A = \frac{k_y a}{\pi}\ln\left(\frac{e}{\gamma}\frac{4\pi}{k_y a}\right) - 2\sum_{n=1}^{\infty}\left[\sin^{-1}\left(\frac{k_y a}{2\pi}\frac{1}{n}\right) - \left(\frac{k_y a}{2\pi}\frac{1}{n}\right)\right] \tag{9}$$

where γ≈1.781 and Napier's constant, e, is 2.718. In addition, it is assumed that a single transverse electric mode above T 326 in FIG. 3C and single TE mode operation in the horizontal portion of the structure to the left of the gap 328. As this entire region is filled with the same dielectric, k$_x$ is assumed below the reference plane T 326 and away from the slot is equal to k$_y$ above T 326.

In order for a transverse resonance to occur, Y$_{up}$ and Y$_{down}$ phases at the resonance plane should cancel, which can be solved for the transverse wavenumber in the horizontal portion of the coupler structure away from the slot as:

$$k_x = \sqrt{k_0^2 \epsilon_r - k_z^2} \tag{10}$$

which in turn yields the longitudinal wavenumber, k$_z$, and subsequently, the propagation β and attenuation α constants.

In comparison to the case of an untapered structure, the tapered structure 202 shown in FIG. 2 provides a progressively higher cutoff frequency as the wave 206 travels longitudinally down the structure. In addition, the traveling wave 206 also exhibits a commensurate increase in the rate of leakage α in the leaky regime. While an untapered structure will leak energy into the covering semi-infinite dielectric, the length required to achieve high levels of coupling is much longer. In this manner, the tapered structure 202 is capable of forcing energy otherwise confined in a quasi-rectangular waveguide mode into a space leaky wave mode in a longitudinally shorter aperture while maintaining a large bandwidth.

It has been shown that the described dielectric 204 into which the leaky wave 208 propagates is compatible with the Rogers Corporation R3006 type laminate dielectric ($\epsilon_r$-rad=6.15). Embodiments of the invention have a desired operating range of 220-320 GHz, the total guide 204 width ranges from approximately 300-400, μm to provide leaky operation across the entire band, while maximizing leakage, α 208, for a given length. These values can be utilized in a full-wave optimization as a starting point to co-optimize the dielectric waveguide cross section 204 and the coupler 202 geometry to minimize insertion loss and coupler return loss.

In some embodiments, the waveguide 204 supports two quasi-transverse-electric modes, the $E_{mn}^x$ and $E_{mn}^y$ modes, in which the bulk of the field is polarized in either the $\hat{x}$ or $\hat{y}$ direction, respectively. The dispersion relationship can be described as:

$$k_z = \beta = \sqrt{\epsilon_r k_0^2 - k_x^2 - k_y^2}, \quad (11)$$

which can be used to determine the cutoff frequencies of a given mode. During initial testing, a test waveguide with a height of approximately 250 μm, a width of approximately 400 μm, and a length of approximately 500 μm was used. In this example, Marcatili's approximation are used to provide a reasonable starting point for full-wave electromagnetic simulation from which optimization is used to converge to a guide cross section that is mode-matched to the tapered coupler structure, maximizing power transfer as described below.

Figure 4:
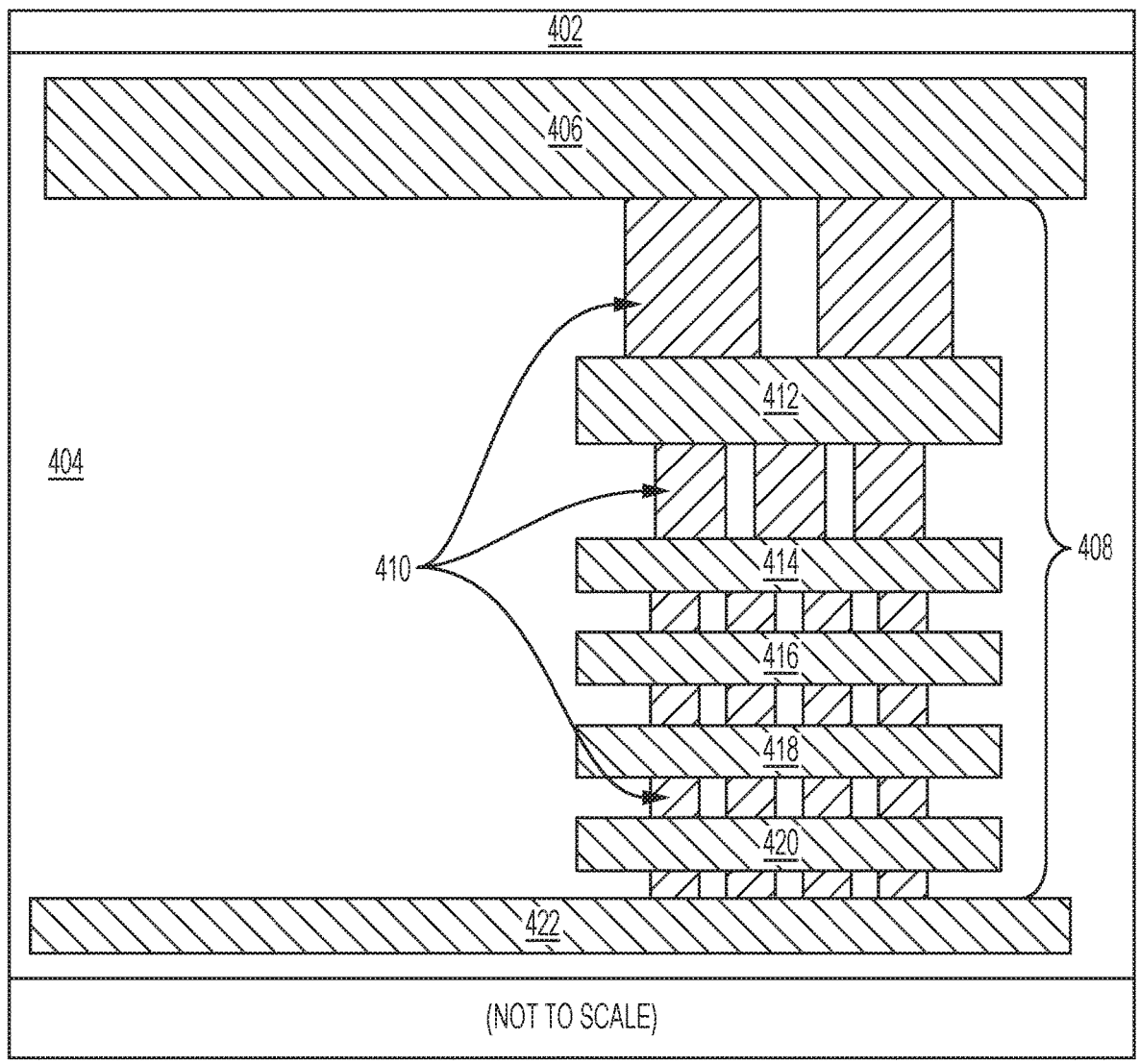
FIG. 4 is an example schematic for a substrate integrated waveguide structure in accordance with embodiment of the invention.

Using the coupler dimensions and the waveguide cross section derived as described above, the coupler and waveguide dimensions ($L_{coupler}$, a, and a+2$d_w$ and a+2$d_n$ at the coupler's wide and narrow widths, respectively) can be designed in the IHP SG13G2 SiGe BiCMOS BEOL process and optimized with the aid of full-wave simulation tools. An example of a designed coupler and waveguide is shown in FIG. 4. In this example, the coupler has a 3 μm thick top metal 406 with a distance of 9.83 μm between the top of the bottom metal 422 and the bottom of the top metal 406. The top metal 406 and bottom metal 422 act as horizontal conductors. The vertical walls 408 of the coupler are composed of intermediate metal interconnects 412-420 and arrays of vias 410.

A simplified model of the structure can be implemented in a commercial full-wave electromagnetic simulation package. In the simplified model, the coupler geometry was excited by a 50Ω source across the structure's slot at the wider end of the coupler as shown in FIG. 2. Immediately on top of this coupler topology, a rectangular fiber with a thickness, dh, of 250 μm (to account for commercially available material thicknesses) rectangular cross-sectional fiber completely overlays the coupler slot and extends 500 μm beyond the narrow end of the structure. The second port of the model consists of a wave port at the end of this 500 μm protrusion. The coupler structure and waveguide dimensions were optimized with a≈3.5 μm, dw≈180 μm at the widest end of the structure, and dn≈100 μm for the narrowest end of the structure to minimize the structure return and insertion loss across the desired 220-325 GHz operating band. From this point, full-wave simulations were executed to tune the coupler length, $L_{Coupler}$.

For example, a coupler length, $L_{coupler}$, of 750 μm can be chosen for fabrication to maintain an average insertion loss of approximately 4 dB with better than 8 dB of return loss across the band, while minimizing on-chip area.

Figure 5:
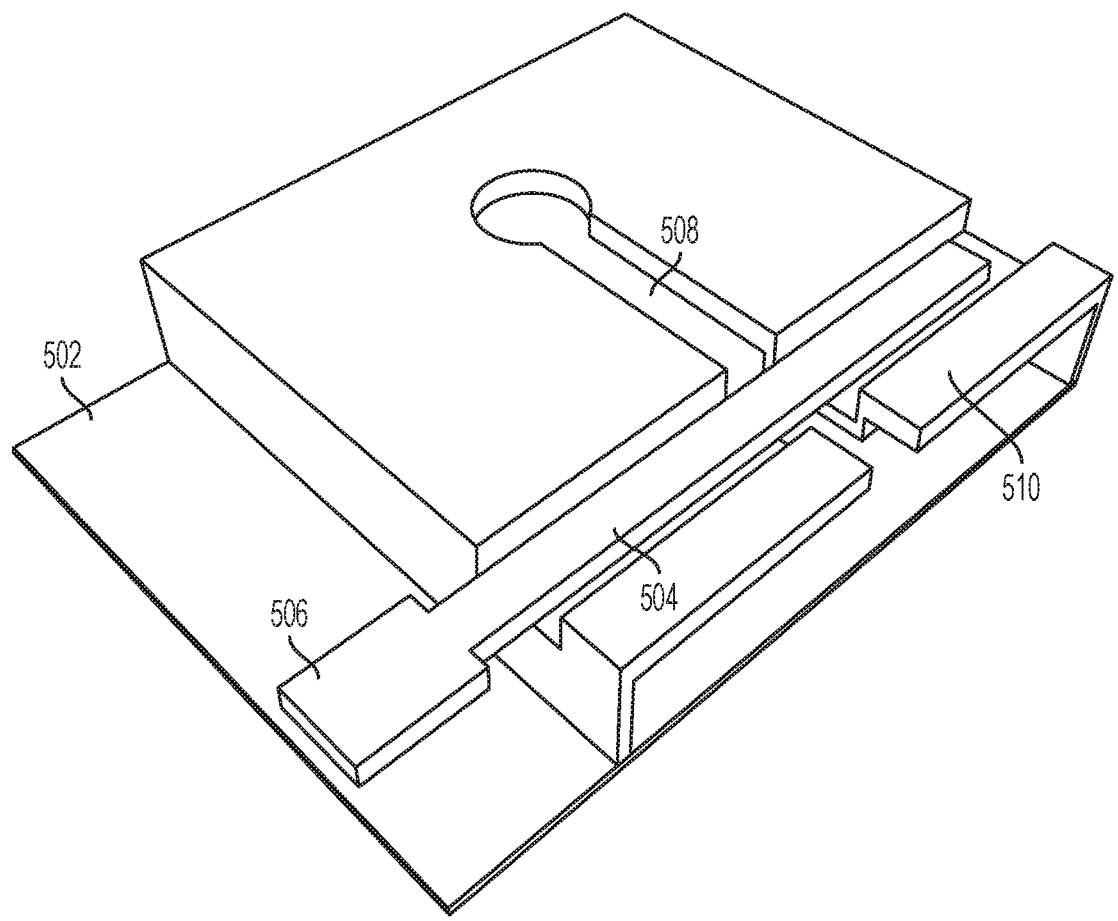
FIG. 5 shows an example mode-converter.

A mode converter such as the one shown in FIG. 5 can be used to facilitate on-wafer testing of the coupler to provide a broadband conversion of an on-wafer 50Ω microstrip mode to a 50Ω slot-line mode, driving the coupler structure. The microstrip feed line 506 is implemented using the top and bottom metal layers described above with respect to FIG. 4, with a trace width of 17 μm. In addition, this mode-converter was used to compensate the slightly inductive input reactance of the coupler. By using Top Metal 1 412 under Top Metal 2 406 from FIG. 4 in the mode-converter feed structure 510, a capacitive waveguide E-plane iris is presented in parallel with the driving point of the coupler input, providing an improved input match. This section of the mode converter presents itself, essentially, as a grounded coplanar 504 waveguide (GCPW) or half of a rectangular coaxial transmission line with a trace width of 4 μm, and a gap width of 20 μm. The distance between the bottom of the signal trace and the GCPW effective ground 502 is 3 μm. The mode converter is approximately a quarter-wave in length at the center of the operating band, comprised of a 170 μm long 3.5 μm wide slot 508 and a 20 μm diameter circular choke for broadband response. This mode converter is designed with the same cross section (width, height, gap width, etc.) as the coupler structure, enabling direct connection to the coupler structure. With the integration of on-chip electronics, this mode-converter may not be necessary, further decreasing the end-to-end insertion loss and reducing the overall coupler size.

On-die calibration standards can be designed and implemented, enabling multiline transmission, reflection, and line (mTRL) calibration. Microstrip lines of lengths commensurate with those driving the coupler and mode-converter structures were available on die to aid in de-embedding the microstrip loss. Lastly, a back-to-back mode-converter was implemented on die to enable de-embedding the response associated with the mode-conversion and subsequent additional dielectric and ohmic losses.

Returning to FIG. 1, the substrate 102 should be selected in order to minimize evanescent mode coupling into areas surrounding the dielectric waveguide 104. For example, a low dielectric constant Rogers TMM3 type laminate ceramic composite material ($\epsilon_r \approx 3.27$) can be used for the substrate 102. In this example, the substrate material can be laser ablated for individual die position, depressed 300 μm from the material surface. Areas underneath the desired dielectric waveguide routing can be removed to reduce the waveguide's evanescent field interaction with the substrate.

In one example, Rogers R3006 type laminate can be selected as the dielectric waveguide interconnect 104 for its specified dielectric constant, machinability, low loss, and wide availability. These waveguides can be made from bulk 250 μm thick unclad R3006 type laminate that are laser cut to a width, dw, of 400±10 μm. In this example, a number of straight and curved waveguide pieces can be cut to align with the individual die and coupler positions after bonding to the test coupon/substrate described below.

After the individual dies 106 are placed, aligned, and bonded to the substrate material 102, the dielectric waveguides can then be individually bonded on top of the chips' passivation layers with, for example, EPOTEK 713 type epoxy. In one case, distance between the top of the individual die passivation layer and the bottom of the dielectric waveguide (denoted as $\Delta H_{gap}$) has an effect on the structures ability to phase shift. For example, compared to a 2.0 cm waveguide with bends, a 2.0 cm straight waveguide has an additional measured average insertion loss of 2.5 dB, partly due to the 17.5 μm $\Delta H_{gap}$. A simulated loss increase corresponding to $\Delta H_{gap}$ shows a significantly reduced insertion loss and increased phase delay of a 0.1 cm waveguide compared to longer waveguides, indicating that this shorter length is short enough to support energy coupling into not only a traveling wave mode in the dielectric guide but also a radiative mode coupled into the opposite side of the link.

After accounting for the excess coupling loss present in 2.0 cm straight guide sample bonds, the 1.0 and 2.0 cm average losses over the band are currently estimated at only 0.5 dB/cm. Given this waveguide loss, it is estimated that the insertion loss of a single coupler is approximately 4.8 dB, which agrees well with the simulated data of approximately 3.8 dB per transition. The performance of this interchip link system exceeds that of the traditional systems. A comparison of available "radio of fiber" coupler performance is provided below in Table I.

TABLE I

| Ref. | Present Invention | Terahertz Interconnect | mm-wave Dielectric Waveguide | mm-wave Link w/ CMOS trans. | Full-duplex Plastic Waveguide |
|---|---|---|---|---|---|
| Center Freqs. | 275 GHz | 195 GHz | 77 GHz 75 GHz | 60 GHz | 57 GHz 80 GHz |
| BW | 50 GHz | 8 GHz | 35 GHz | 6 GHz | 6 GHz |
| Ins. Loss | 4.8 dB | 5.8 dB | 5 dB | 6 dB | 7 dB (est) |
| Guide Cross | 400 μm | 500 μm | 850 μm | 1.6 mm | 1.1 mm |
| Section | 250 μm | 300 μm | 850 μm | Radius | 8 mm |
| Notes | 1 | 2 | 3 | 2 | 3 |

1 On-chip coupler with a planar chip-waveguide interface
2 On-chip coupler with the waveguide attached to the chip at 90° angle
3 Off-chip coupler with a planar chip-waveguide interface Embodiments of the invention provide a fully integrated on-chip traveling wave power coupler, based on a differentially driven HM-SIW structure, co-designed with a low-cost planar rectangular dielectric waveguide. The described structure achieves an insertion loss of 4.8 dB, which is the lowest among all published works in the millimeter-wave frequency band. The increased operating frequency provides the smallest waveguide cross section and the potential for a lower guide-to-guide pitch. A usable bandwidth of 50 GHz was measured during testing, which provides an opportunity for very high data rate transmission. Further, the described structure provides the most straightforward path for on-chip integration. The proposed coupler structure also enables the simplest implementation of a planar interface between the chip and dielectric waveguide. The simple system-level planar integration makes use of low-cost commercially available materials already in widespread use in the printed circuit board (PCB) industry.

The described structure is demonstrated for the first time at these frequencies, providing smaller guide size, lower pitch, and more available bandwidth than demonstrated in traditional system. Lastly, the small differences in losses between the 1.0 and 2.0 cm samples indicates low loss in this guide material at these frequencies, approximately 0.5 dB/cm. This in-guide loss makes this invention viable for link lengths up to approximately one meter.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. A system comprising:
   a first integrated circuit;
   a second integrated circuit;
   a coupler structure to connect the first and second integrated circuits, the coupler structure including a base portion and a top portion that are connected by two vertical walls,
   the top portion having a gap that increases a strength of a transverse electric field across the gap when the coupler structure is operating in an odd higher order mode that is horizontally polarized, wherein the coupler structure is full of a dielectric material, and wherein a cross-sectional width of the coupler structure is tapered in a direction of wave propagation; and
   a dielectric waveguide attached to the top portion of the coupler structure, the dielectric waveguide supporting the odd higher order mode and an even higher order mode.

2. The system of claim 1, wherein a cutoff frequency for operating the dielectric waveguide in the odd higher order mode is determined according to a dispersion relationship described as:

$$k_z = \beta = \sqrt{\epsilon_{r1} k_0^2 - k_x^2 - k_y^2}$$

wherein $k_z$ is a longitudinal wavenumber of the coupler structure, $\beta$ is a propagation constant, $\epsilon_{r1}$ is a dielectric constant of the dielectric waveguide, $k_x$ is a transverse wavenumber in a horizontal portion of the coupler structure, $k_0$ is a freespace wavenumber, $k_y$ is a transverse wavenumber in a vertical portion of the coupler structure.

3. The system of claim 1, each of the two vertical walls comprises a plurality of via arrays that are connected by a plurality of intermediate metal interconnects, wherein a height of each of the plurality of via arrays from the top portion to the bottom portion are progressively shorter.

4. The system of claim 3, wherein the top portion is approximately 3 μm thick, and wherein a distance between a bottom of the top portion and a top of the bottom portion is approximately 9.83 μm.

5. The system of claim 3, wherein the plurality of intermediate metal interconnects are composed of aluminum and the plurality of via arrays are composed of tungsten.

6. The system of claim 3, further comprising a mode-converter affixed to a wave generating end of the coupler structure and having a same cross section as the coupler structure, the mode-converter comprising a coplanar waveguide for generating a wave that transmits from the first integrated circuit to the second integrated circuit through the coupler structure, wherein a topmost of said plurality of intermediate metal interconnects is a same metal material as the coplanar waveguide, which presents a capacitive waveguide iris in parallel with a driving point of the coupler structure.

7. The system of claim 6, wherein the capacitive waveguide iris behaves as a half of a rectangular coaxial transmission line with a trace width of 4 µm, and a gap width of 20 µm.

8. The system of claim 1, wherein the dielectric waveguide has an operating range of 220-325 GHz.

9. The system of claim 1, wherein the dielectric waveguide has a width of approximately 300-400 µm.

10. The system of claim 1, wherein the first and second integrated circuits are affixed to a circuit board that is composed of a ceramic laminate material with a dielectric constant of 3.27.

11. The system of claim 1, wherein a longitudinal length of the coupler structure is approximate 750 µm.

* * * * *